United States Patent
Kim et al.

(10) Patent No.: US 11,966,288 B2
(45) Date of Patent: Apr. 23, 2024

(54) ELECTRONIC APPARATUS PERFORMING SELF-TEST USING SELF-TEST APPLICATION AND CONTROL METHOD THEREOF

(71) Applicant: SAMSUNG ELECTRONICS CO., LTD., Suwon-si (KR)

(72) Inventors: Jaehoon Kim, Suwon-si (KR); Sungjun Kim, Suwon-si (KR); Kyuseon Son, Suwon-si (KR); Seunghee Shin, Suwon-si (KR); Myunggyun Yoon, Suwon-si (KR); Youngchang Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 143 days.

(21) Appl. No.: 17/668,813

(22) Filed: Feb. 10, 2022

(65) Prior Publication Data

US 2022/0253353 A1 Aug. 11, 2022

Related U.S. Application Data

(63) Continuation of application No. PCT/KR2022/001368, filed on Jan. 26, 2022.

(30) Foreign Application Priority Data

Feb. 10, 2021 (KR) .................. 10-2021-0019477

(51) Int. Cl.
*G06F 11/10* (2006.01)
*G06F 11/263* (2006.01)
(Continued)

(52) U.S. Cl.
CPC ........ *G06F 11/1068* (2013.01); *G06F 11/263* (2013.01); *G06F 11/27* (2013.01); *G06F 11/327* (2013.01)

(58) Field of Classification Search
None
See application file for complete search history.

(56) References Cited

U.S. PATENT DOCUMENTS 10,977,166 B1 * 4/2021 Jaganmohan ............ G06N 5/02
2009/0150819 A1 * 6/2009 Cheong ............... G06F 3/04883
715/771

(Continued)

FOREIGN PATENT DOCUMENTS

JP 2008-271126 11/2018
KR 10-0212194 8/1999
(Continued)

OTHER PUBLICATIONS

H. A. Toku, "Developing new Automatic Test Equipments (ATE) using systematic design approaches," 2013 IEEE Autotestcon, Schaumburg, IL, USA, 2013, pp. 1-7, doi: 10.1109/AUTEST.2013.6645035. (Year: 2013).*

(Continued)

*Primary Examiner* — Daniel F. McMahon
(74) *Attorney, Agent, or Firm* — Nixon & Vanderhye P.C.

(57) ABSTRACT

In an electronic apparatus, a processor executes a program stored in memory to perform essential functions. In the event of an error related to these functions, a self-test application is triggered. The processor may identify a relevant test routine from a set of routines, conduct tests on the function using the identified routine, and communicate the test results to a display. Accordingly, when an error occurs while the electronic apparatus is operating, the electronic apparatus can inform a user and a manufacturer of a cause of the error.

11 Claims, 12 Drawing Sheets

(51) Int. Cl.
*G06F 11/27* (2006.01)
*G06F 11/32* (2006.01)

(56) References Cited

U.S. PATENT DOCUMENTS

| | | | |
|---|---|---|---|
| 2010/0161280 A1* | 6/2010 | Okayasu | G01R 31/31908 |
| | | | 702/183 |
| 2017/0075784 A1* | 3/2017 | Nakanishi | G06F 11/3692 |
| 2018/0012485 A1* | 1/2018 | Park | G08C 23/04 |
| 2019/0324833 A1* | 10/2019 | Kobayashi | G06F 3/1293 |
| 2019/0384698 A1* | 12/2019 | Hung | G06V 10/774 |
| 2020/0334094 A1* | 10/2020 | Morgenstern | G06F 11/073 |
| 2021/0092620 A1* | 3/2021 | Hsieh | H04W 48/16 |

FOREIGN PATENT DOCUMENTS

| | | |
|---|---|---|
| KR | 10-2005-0012535 | 2/2005 |
| KR | 10-0547747 | 1/2006 |
| KR | 10-0560924 | 3/2006 |
| KR | 10-2009-0060622 | 6/2009 |
| KR | 10-1626581 | 6/2016 |
| KR | 10-1953117 | 5/2019 |

OTHER PUBLICATIONS

Search Report and Written Opinion dated May 30, 2022 in counterpart International Patent Application No. PCT/KR2022/001368.

* cited by examiner

ELECTRONIC APPARATUS PERFORMING SELF-TEST USING SELF-TEST APPLICATION AND CONTROL METHOD THEREOF

CROSS-REFERENCE TO RELATED APPLICATIONS

This application is a continuation of International Application No. PCT/KR2022/001368 designating the United States, filed on Jan. 26, 2022, in the Korean Intellectual Property Receiving Office and claiming priority to Korean Patent Application No. 10-2021-0019477, filed on Feb. 10, 2021, in the Korean Intellectual Property Office, the disclosures of which are incorporated by reference herein in their entireties.

BACKGROUND

Field

The disclosure relates to an electronic apparatus capable of implanting various functions by executing various applications on an operating system and a control method thereof, and for example to an electronic apparatus, which diagnoses a problem that may occur when a predetermined function is implemented, and analyzes and reports a cause of the problem, and a control method thereof.

Description of Related Art

To compute and process predetermined information in accordance with certain processes, an electronic apparatus basically includes a central processing unit (CPU), a chipset, a memory, and the like electronic components for the computation. Such an electronic apparatus may be variously classified in accordance with what information will be processed and what it is used for. For example, the electronic apparatus is classified into an information processing apparatus such as a personal computer (PC), a server or the like for processing general information; an image processing apparatus for processing image data; an audio apparatus for audio process; home appliances for miscellaneous household chores; etc. The image processing apparatus may be embodied as a display apparatus that displays an image based on processed image data on its own display panel. In particular, there is a mobile device miniaturized to be portable among the display apparatuses, and the mobile device may for example include a smartphone a tablet computer, etc.

Various electronic apparatuses have multiple functions to carry out various operations. When an error occurs in a certain function implemented by the electronic apparatus, a test is needed to diagnose the cause of the error. The cause of the error is investigated through the test, so that the function can be normally implemented by taking measures to cope with the cause. As an example of a diagnostic testing method, when an error occurs in a certain function of the electronic apparatus, the electronic apparatus is connected to a test computer and the test computer performs a test for the electronic apparatus. However, such a method requires a user to carry the electronic apparatus and go to a place where the test computer is present (for example, a customer service center of a manufacturer of the electronic apparatus), and it is therefore difficult for a user to test the electronic apparatus in a place where the test computer is absent.

The electronic apparatus is provided to display a popup message for guiding an error when the error occurs in a function being currently executed. The electronic apparatus can inform a user of what kind of error has occurred, but not inform the user what the cause of the error is. For example, when a user searches the Internet sites through a web browser in the electronic apparatus, an error that the Internet site is not normally displayed may occur. Although it is informable through the electronic apparatus that the error has occurred, the user cannot be informed of whether the error is caused by the electronic apparatus itself (for example, a problem in a communication chip, etc.) or caused by external factors of the electronic apparatus (for example, a problem in a router, a gateway, a server, etc. communicating with the electronic apparatus).

Accordingly, when an error occurs while the electronic apparatus is operating, the electronic apparatus may be required to inform a user and a manufacturer of the cause of the error.

SUMMARY

According to an example embodiment of the disclosure, an electronic apparatus is provided, the electronic apparatus including: a memory configured to store a program to perform at least one function; and a processor configured to: implement the at least one function of the electronic apparatus by executing the program stored in the memory, execute a self-test application provided for a self-test of an error in response to occurrence of the error related to the function, identify a test routine for the error among one or more test routines, obtain a test result of the error by testing the function based on the identified test routine, and output information about the obtained test result to a display.

The test routine may include a test criterion provided for the error in a processing stage of the electronic apparatus.

The electronic apparatus may further include a wireless communication module comprising wireless communication circuitry configured to wirelessly communicate with an external apparatus, wherein the processor is configured to control the wireless communication module to transmit information about the test result to the external apparatus that has previously been authenticated.

The processor may be configured to control the wireless communication module to transmit information about conditions of the test and characteristics and operations of the electronic apparatus to the external apparatus.

The processor may be configured to identify that the error is caused by the electronic apparatus based on the test result showing abnormality, and identify that the error is not caused by the electronic apparatus based on the test result showing normality.

The processor may be configured to identify normality or abnormality based on similarity between the test criterion of the identified test routine and the test result.

The self-test application is configured to operate as a background process, and identify the test routine corresponding to the error based on the occurrence of the error.

The processor may be configured to store the test result in a security storage region of the memory to be managed by the self-test application.

The processor may be configured to display a user interface (UI) to ask for an input about whether to execute the self-test in response to the occurrence of the error, and execute the self-test based on a user's input received through the UI.

According to an example embodiment of the disclosure, a method of controlling an electronic apparatus is provided, the method including: implementing at least one function of the electronic apparatus by executing a program stored in a memory; executing a self-test application provided for a self-test of an error in response to occurrence of the error related to the function, identifying a test routine for the error among one or more test routines; obtaining a test result of the error by testing the function based on the identified test routine; and outputting information about the obtained test result to be displayed.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
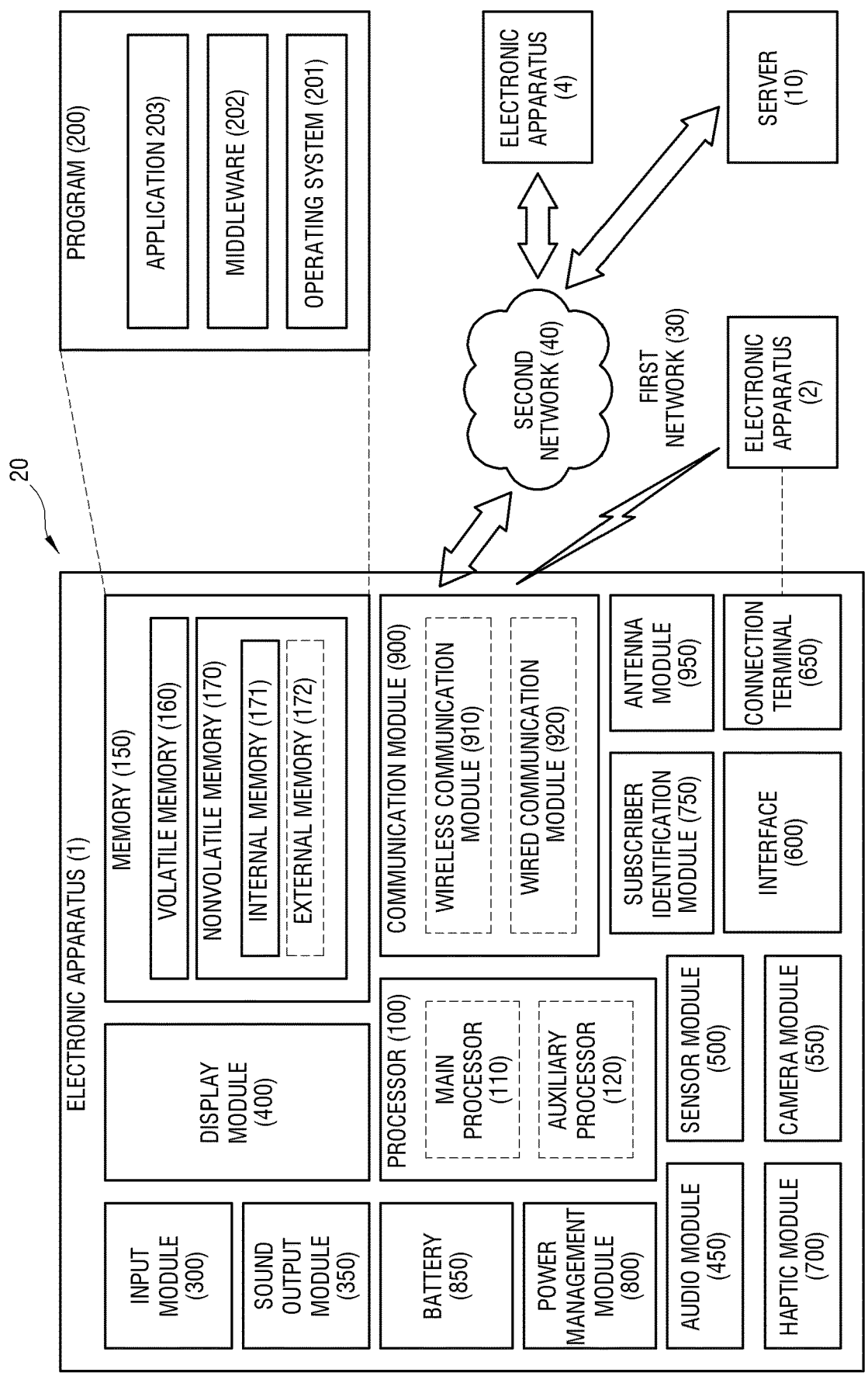
FIG. 1 is a block diagram illustrating an example electronic apparatus in a network environment according to various embodiments.

Below, various example embodiments will be described in greater detail with reference to accompanying drawings. Further, the embodiments described with reference to the accompanying drawings are not exclusive to each other unless otherwise mentioned, and a plurality of embodiments may be selectively combined within one apparatus. The combination of these plural embodiments may be discretionally selected and applied to realize the technical concept by a person having an ordinary skill in the art.

Various example embodiments of the disclosure and the terms used herein are not intended to limit the technical features described in the disclosure to specific embodiments, and it will be understood that they include various modifications, equivalents, and/or alternatives to the corresponding embodiments. In terms of the drawings, similar reference numerals may be used for similar or related elements. A singular form of a noun corresponding to an item is intended to include one item or a plurality of items unless otherwise mentioned contextually. In the disclosure, the phrases "A or B", "at least one of A and B", "at least one of A or B", "A, B or C", "at least one of A, B and C", "at least one of A, B or B", or the like may include one, or all possible combinations of elements enumerated together in the corresponding phrase. The terms "first", "second", etc. are used simply to distinguish one element from another, and do not limit the elements in other aspects (for example, importance or order).

FIG. 1 is a block diagram illustrating an example configuration of an electronic apparatus in a network environment according to various embodiments.

As shown in FIG. 1, in a network environment 20, an electronic apparatus 1 may communicate with an electronic apparatus 2 through a first network 30 (e.g., a short-range wireless communication network), or communicate with at least one of an electronic apparatus 4 or a server 10 through a second network 200 (e.g., a long-range wireless communication network). According to an embodiment, the electronic apparatus 1 may communicate with the electronic apparatus 4 with the server 10. According to an embodiment, the electronic apparatus 1 may include a processor 100, a memory 150, an input module 300, a sound output module 350, a display module 400, an audio module 450, a sensor module 500, a camera module 550, an interface 600, a connection terminal 650, a haptic module 700, a subscriber identification module (SIM) 750, a power management module 800, a battery 850, a communication module 900, or an antenna module 950. In various embodiments, the electronic apparatus 1 may exclude at least one (e.g., the connection terminal 650) of these elements, or may additionally include one or more other elements. In various embodiments, some (e.g., the sensor module 500, the camera module 550, or the antenna module 950) of these elements may be integrated into a single element (e.g., the display module 400).

The processor 100 may for example execute software (e.g., a program 200) to control at least one of other elements (e.g., hardware or software elements) of the electronic apparatus 1 connected to the processor 100, and to perform various data processes or operations. According to an embodiment, as at least a part of the data process or operation, the processor 100 may store an instruction or data received from other elements (e.g., the sensor module 500 or the communication module 900) in a volatile memory 160, process the instruction or data stored in the volatile memory 160, and store data of processing results in a nonvolatile memory 170. According to an embodiment, the processor 100 may include a main processor 110 (e.g., a central processing unit or an application processor), or may include an auxiliary processor 120 (e.g., a graphic processing unit, a neural processing unit (NPU), an image signal processor, a sensor hub processor, or a communication processor) independently or with the main processor 110. For example, when the electronic apparatus 1 includes both the main processor 110 and the auxiliary processor 120, the auxiliary processor 120 may be set to use less power than the main processor 110 or to specialize in a designated function. The auxiliary processor 120 may be embodied separately from or as a part of the main processor 110.

The auxiliary processor 120 may for example control at least a part of functions or states related to at least one element (e.g., the display module 400, the sensor module 500 or the communication module 900) among the elements of the electronic apparatus 1, instead of the main processor 110 while the main processor 110 is inactive (e.g., sleep), or with the main processor 110 while the main processor 110 is active (e.g., to execute an application). According to an embodiment, the auxiliary processor 120 (e.g., the image signal processor or the communication processor) may be embodied as a part of other functionally-related elements (e.g., the camera module 550 or the communication module 900). According to an embodiment, the auxiliary processor 120 (e.g., the NPU) may include a hardware structure that specialize in processing an artificial intelligence (AI) model. The AI model may be created through machine learning. Such learning may for example be performed in the electronic apparatus 1 itself on which the AI model is processed, or may be performed through a separate server (e.g., the server 10). The learning algorithm may for example include but not be limited to supervised learning, unsupervised learning, semi-supervised learning, or reinforcement learning. The AI model may include a plurality of artificial neural network layers. The artificial neural network may include but be not limited to a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-networks, or one of two or more combinations thereof. Besides the hardware structure, the AI model may additionally or alternatively include a software structure.

The memory 150 may be configured to store various pieces of data to be used for at least one element (e.g., the processor 100 or the sensor module 500) of the electronic apparatus 1. The data may for example include software (e.g., the program 200), input data or output data with regard to an instruction related to the software. The memory 150 may include the volatile memory 160 or the nonvolatile memory 170. The nonvolatile memory 170 may include an internal memory 171 provided inside the electronic apparatus 1, and an external memory 172 connected to the electronic apparatus 1 from the outside. Alternatively, the external memory 172 may be designed to the processor 20 through various connection means such as the connection terminal 650.

The program 200 may be stored as software in the memory 150, and may for example include an operating system 201, a middleware 202, or an application 203.

The input module 300 may receive the instruction or data to be used for the element (e.g., the processor 100) of the electronic apparatus 1 from the outside (e.g., a user) of the electronic apparatus 1. The input module 300 may for example include a microphone, a mouse, a keyboard, a key (e.g., a button), or a digital pen (e.g., a stylus pen).

The sound output module 350 may output a sound signal to the outside of the electronic apparatus 1. The sound output module 350 may for example include a loudspeaker or a receiver. The loudspeaker may be used for general purposes such as multimedia reproduction, or recording reproduction. The receiver may be used for receiving an incoming call. According to an embodiment, the receiver may be embodied separately from or as a part of the loudspeaker.

The display module 400 may visually provide information to the outside (e.g., a user) of the electronic apparatus 1. The display module 400 may for example include a display, a hologram device or a projector, and a control circuit for controlling the corresponding device. According to an embodiment, the display module 400 may include a touch sensor set to detect a touch, or a pressure sensor set to measure the strength of force caused by the touch.

The audio module 450 may convert a sound into an electric signal or may reversely convert an electric signal into a sound. According to an embodiment, the audio module 450 may obtain a sound through the input module 300, or output a sound through the sound output module 350, or an external electronic apparatus (e.g., the electronic apparatus 2, the loudspeaker or a headphone) directly or wirelessly connected to the electronic apparatus 1.

The sensor module 500 may detect the operating state of the electronic apparatus 1 (e.g., power or temperature) or the state of an external environment (e.g., a user condition), and generate an electric signal or data value corresponding to the detected state. According to an embodiment, the sensor module 500 may for example include a gesture sensor, a gyro sensor, a barometer, a magnetic sensor, an accelerometer, a grip sensor, a proximity sensor, a color sensor, an infrared (IR) sensor, a biometric sensor, a temperature sensor, a humidity sensor, or an illuminance sensor.

The interface 600 may support one or more designated protocols to be used by the electronic apparatus 1 to be directly or wirelessly connected to the external electronic apparatus (e.g., the electronic apparatus 2). According to an embodiment, the interface 600 may for example include a high-definition multimedia interface (HDMI), a universal serial bus (USB) interface, a secured digital (SD) card interface, or an audio interface.

The connection terminal 650 may include a connector by which the electronic apparatus 1 is physically connectable to the external electronic apparatus (e.g., the electronic apparatus 2). According to an embodiment, the connection terminal 650 may for example include an HDMI connector, a USB connector, an SD card connector, or an audio connector (e.g., a headphone connector).

The haptic module 700 may convert an electric signal into a mechanical stimulus (e.g., vibration or movement) or an electric stimulus to be recognized by a user through tactile or kinesthetic senses. According to an embodiment, the haptic module 700 may for example include a motor, a piezoelectric device, or an electro-stimulator.

The camera module 550 may be configured to take a still image or a moving image. According to an embodiment, the camera module 550 may include one or more lenses, image sensors, image signal processors, or flashes.

The power management module 800 may be configured to manage power supplied to the electronic apparatus 1. According to an embodiment, the power management module 800 may for example be embodied as at least a part of a power management integrated circuit (PMIC).

The battery 850 may supply power to at least one element of the electronic apparatus 1. According to an embodiment, the battery 850 may for example include a non-rechargeable primary cell, a rechargeable secondary cell, or a fuel cell.

The communication module 900 may establish a direct (e.g., wired) communication channel or wireless communication channel between the electronic apparatus 1 and the external electronic apparatus (e.g., the electronic apparatus 2, the electronic apparatus 4, or the server 10), and support communication based on the established communication channel. The communication module 900 may operate independently of the processor 100 (e.g., the application processor), and include one or more communication processors to support the direct (e.g., wired) communication or wireless communication. According to an embodiment, the communication module 900 may include a wireless communication module 910 (e.g., a cellular communication module, a short-range wireless communication module, or a global navigation satellite system (GNSS) communication module) or a wired communication module 94 (e.g., a local area network (LAN) communication module, or a power-line communication module). Among these communication modules, the corresponding communication module may communicate with the external electronic apparatus 4 through the first network 30 (e.g., Bluetooth, Wi-Fi direct or infrared data association (IrDA) or the like short-range communication network) or the second network 200 (e.g., a legacy cellular network, a 5G network, a next-generation communication network, the Internet, a computer network (e.g., LAN or a wide area network (WAN)), or the like long-range communication network). Such various kinds of communication modules may be integrated into one element (e.g., a single chip), or a plurality of element (e.g., a plurality of chips) separated from one another. The wireless communication module 910 may use subscriber information (e.g., international mobile subscriber identity (IMSI)) stored in the subscriber identification module 750 to identify or authenticate the electronic apparatus 1 in the communication network such as the first network 30 or the second network 200.

The wireless communication module 910 may support a 5G network and the next-generation communication technology, for example, new radio (NR) access technology, after the 4G network. The NR access technology may support high-speed transmission of high-capacity data (enhanced mobile broadband (eMBB)), minimization of terminal power and access of multiple terminals (massive machine type communications (mMTC)), or ultra-reliable and low-latency communications (URLLC). The wireless communication module 910 may for example support a high frequency band (e.g., an mmWave band) to achieve a high data-transmission rate. The wireless communication module 910 may support various technologies for securing performance in a high frequency band, for example, beamforming, massive multiple-input and multiple-output (MIMO), full dimensional MIMO (FD-MIMO), an array antenna, analog beam-forming, a large-scale antenna, or the like technologies. The wireless communication module 910 may support various requirements stipulated in the electronic apparatus 1, the external electronic apparatus (e.g., the electronic apparatus 4) or the network system (e.g., the second network 200). According to an embodiment, the wireless communication module 910 may support a peak data rate (e.g., higher than or equal to 20 Gbps) for the eMBB, loss coverage (e.g., lower than or equal to 164 dB) for the mMTC, or U-plane latency (e.g., lower than or equal to 0.5 ms at downlink (DL) and uplink (UL), or lower than or equal to 1 ms at a round trip) for the URLLC.

The antenna module 950 may be configured to transmit or receive a signal or power to the outside (e.g., the external electronic apparatus) or from the outside. According to an embodiment, the antenna module 950 may include an antenna with an emitter provided as a conductor or conductive pattern formed on a substrate (e.g., a printed circuit board (PCB)). According to an embodiment, the antenna module 950 may include a plurality of antennas (e.g., an array antenna). In this case, at least one antenna suitable for communication used in the first network 30, the second network 200 or the like communication network may for example be selected by the communication module 900 among the plurality of antennas. The signal or power may be transmitted or received between the communication module 900 and the external electronic apparatus through at least one antenna selected as above. According to various embodiments, besides the emitter, another element (e.g., a radio frequency integrated circuit (RFIC)) may be additionally formed as a part of the antenna module 950.

According to various embodiments, the antenna module 950 may form an mmWave antenna module. According to an embodiment, the mmWave antenna module may include the RFIC disposed on or adjacent to a PCB, on a first surface (e.g., on a bottom surface) of the PCB and capable of supporting a designated high-frequency band (e.g., the mmWave band), and a plurality of antennas (e.g., the array antenna) disposed on or adjacent to a second surface (e.g., on a top or lateral surface) of the PCB and capable of transmitting or receiving a signal in the designated high-frequency band.

At least some among the elements may be connected to each other through a communication method between peripheral units (e.g., a bus, a general-purpose input and output (GPIO)), a serial peripheral interface (SPI), or a mobile industry processor interface (MIPI)), and exchange a signal (e.g., the instruction or data) with each other.

According to an embodiment, the instruction or data may be transmitted or received between the electronic apparatus 1 and the external electronic apparatus 4 through the server 10 connected to the second network 200. Each external electronic apparatus 2 or 4 may be the same or different type of apparatus as the electronic apparatus 1. According to an embodiment, all or some operations performed in the electronic apparatus 1 may be performed in one or more external electronic apparatuses among the external electronic apparatuses 2, 4 or 10. For example, when the electronic apparatus 1 needs to perform a certain function or service automatically or in response to a request from a user or another apparatus, the electronic apparatus 1 may request one or more external electronic apparatuses to execute at least a part of the function or service instead of or in addition to execution of the function or service in itself. One or more external electronic apparatuses, which have received the request, may execute at least a part of the requested function or service, or an additional function or service related to the request, and transmit a result of the execution to the electronic apparatus 1. The electronic apparatus 1 may provide the result as it is or as it is additionally processed, as at least a part of response to the request. To this end, there may be used computing technologies, for example, cloud computing, distributed computing, mobile edge computing (MEC), or client-server computing. The electronic apparatus 1 may for example employ the distributed computing or the MEC to provide a ultra-low latency service. According to an embodiment, the external electronic apparatus 4 may employ an Internet of things (IoT) device. The server 10 may include an intelligent server based on the machine learning and/or neural network. According to an embodiment, the external electronic apparatus 4 or the server 10 may be included in the second network 200. The electronic apparatus 1 may be applied to an intelligent service (e.g., a smart home, a smart city, a smart car, or health care) based on the 5G communication technology and IoT-related technology.

The electronic apparatus 1 according to various embodiments of the disclosure may include various types of apparatuses. The electronic apparatus 1 may for example include a mobile communication apparatus (e.g., a smartphone), a computer system, a portable multimedia device, a portable medical apparatus, a camera, a wearable device, home appliances, or the like. The electronic apparatus 1 according to the embodiments of the disclosure is not limited to the foregoing apparatuses.

Figure 2:
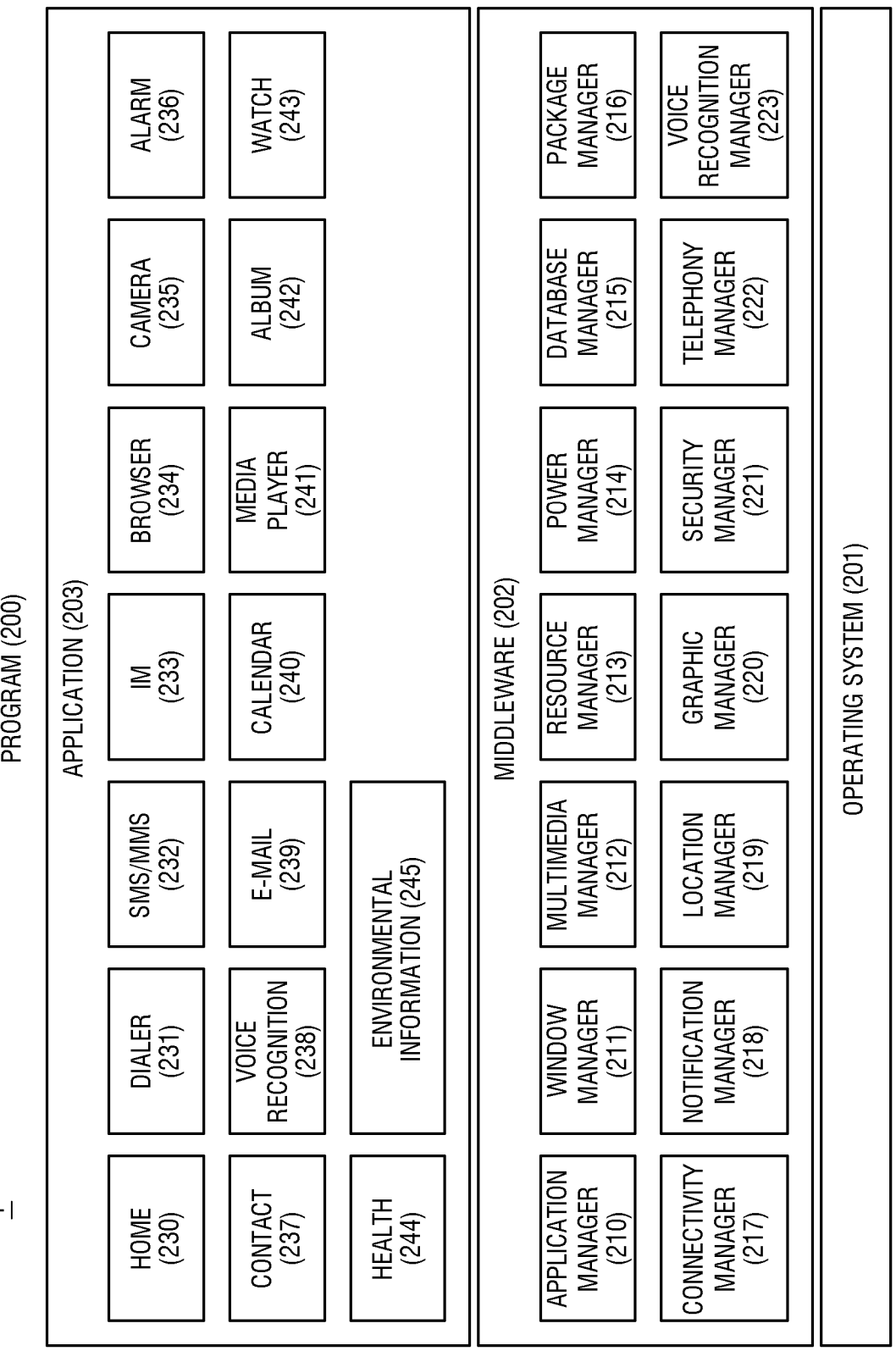
FIG. 2 is a block diagram illustrating an example configuration of a program according to various embodiments.

FIG. 2 is a block diagram illustrating an example configuration of a program according to various embodiments.

As shown in FIGS. 1 and 2, a program 200 according to an embodiment may include an operating system 201 for controlling one or more resources of an electronic apparatus 1, middleware 202, or an application 203 running on the operating system 201. The operating system 201 may for example include Android™, iOS™, Windows™, Symbian™, Tizen™, or Bada™. At least a part of the program 200 may for example be preloaded into the electronic apparatus 1 when manufactured, or downloaded or updated from an external electronic apparatus (e.g., an electronic apparatus 2 or 4, or a server 10) when used by a user.

The operating system 201 may control management (e.g., allocation or recovery) of one or more system resources (e.g., a process, a memory, or power) of electronic apparatus 1. The operating system 201 may additionally or alternatively include one or more driver programs for driving other hardware devices of the electronic apparatus 1, for example, an input module 300, a sound output module 350, a display module 400, an audio module 450, a sensor module 500, an interface 600, a haptic module 700, a camera module 550, a power management module 800, a battery 850, a communication module 900, a subscriber identification module 750, or an antenna module 950.

The middleware 202 may provide various functions to the application 203 so that a function or information from one or more resources of the electronic apparatus 1 can be used by the application 203. The middleware 202 may for example include an application manager 210, a window manager 211, a multimedia manager 212, a resource manager 213, a power manager 214, a database manager 215, a package manager 216, a connectivity manager 217, a notification manager 218, a location manager 219, a graphic manager 220, a security manager 221, a telephony manager 222, or a voice recognition manager 223.

The application manager 210 may for example manage the lifecycle of the application 203. The window manager 211 may for example manage one or more graphic user interface (GUI) resources used in a screen. The multimedia manager 212 may for example identify one or more formats needed for reproducing media files, and encode or decode a corresponding media file among the media files based on a codec for a format selected among the identified formats. The resource manager 213 may for example manage the source code of the application 203 or the space of the memory 150. The power manager 214 may for example manage the capacity, temperature or power of the battery 850, and identify or provide relevant information needed for operations of the electronic apparatus 1 based on the corresponding information among the capacity, temperature and power. According to an embodiment, the power manager 214 may interwork with a basic input/output system (BIOS) (not shown) of the electronic apparatus 1.

The database manager 215 may for example create, retrieve or modify a database to be used by the application 203. The package manager 216 may for example manage installation or update of the application distributed in the form of a package file. The connectivity manager 217 may for example manage wireless connection or direct connection between the electronic apparatus 1 and the external electronic apparatus 2 or 4. The notification manager 218 may for example provide a function for notifying a user of occurrence of a designated event (e.g., an incoming call, a message or an alarm). The location manager 219 may for example manage the location information of the electronic apparatus 1. The graphic manager 220 may for example manage one or more graphic effects to be provided to a user, or user interfaces related to the graphic effects.

The security manager 221 may for example provide system security or user authentication. The telephony manager 222 may for example manage a voice call function or a video call function provided by the electronic apparatus 1. The voice recognition manager 223 may for example transmit a user's voice data to the server 10, and receive a command corresponding to a function to be implemented in the electronic apparatus 1 based on at least a part of the voice data or text data converted based on at least a part of the voice data from the server 10. According to an embodiment, the middleware 202 may dynamically remove some elements from the existing elements or add new elements. According to an embodiment, at least a part of the middleware 202 may be included as a part of the operating system 201, or may be embodied as separate software different from the operating system 201.

The application 203 may for example include applications for a home 230, a dialer 231, a short message service (SMS)/multimedia message service (MMS) 232, an instant message (IM) 233, a browser 234, a camera 235, an alarm 236, contact 237, voice recognition 238, e-mail 239, a calendar 240, a media player 241, an album 242, a watch 243, health 244 (e.g., measurement of biometric information such as the amount of exercise or blood sugar), or environmental information 245 (e.g., measurement of atmospheric pressure, humidity, or temperature information). According to an embodiment, the application 203 may further include an information exchanging application (not shown) to support exchange of information between the electronic apparatus 1 and the external electronic apparatus 2 or 4. The information exchanging application may for example may include a notification relay application set to transmit designated information (e.g., the call, the message, or the alarm) to the external electronic apparatus, or an apparatus management application set to manage the external electronic apparatus. The notification relay application may for example transmit notification information, which corresponds to an event (e.g., an incoming mail) generated in another application (e.g., the e-mail application 239) of the electronic apparatus 1, to the external electronic apparatus. Additionally or alternatively, the notification relay application may receive the notification information from the external electronic apparatus and provide it to a user of the electronic apparatus 1.

The apparatus management application may for example control the power (e.g., turn on or off) or the function (e.g., brightness, resolution or focus) of the external apparatus or some elements (e.g., the display module or the camera module of the external electronic apparatus) communicating with the electronic apparatus 1. The apparatus management application may additionally or alternatively support the installation, deletion or update of the application running on the external electronic apparatus.

With the foregoing structure, the electronic apparatus 1 may detect an error which occurs in a function while implementing a predetermined function based on various hardware components or various applications 203 running in connection with the hardware components. Below, operations of the electronic apparatus 1, which is performed when occurrence of an error is detected in a certain function, will be described.

Figure 3:
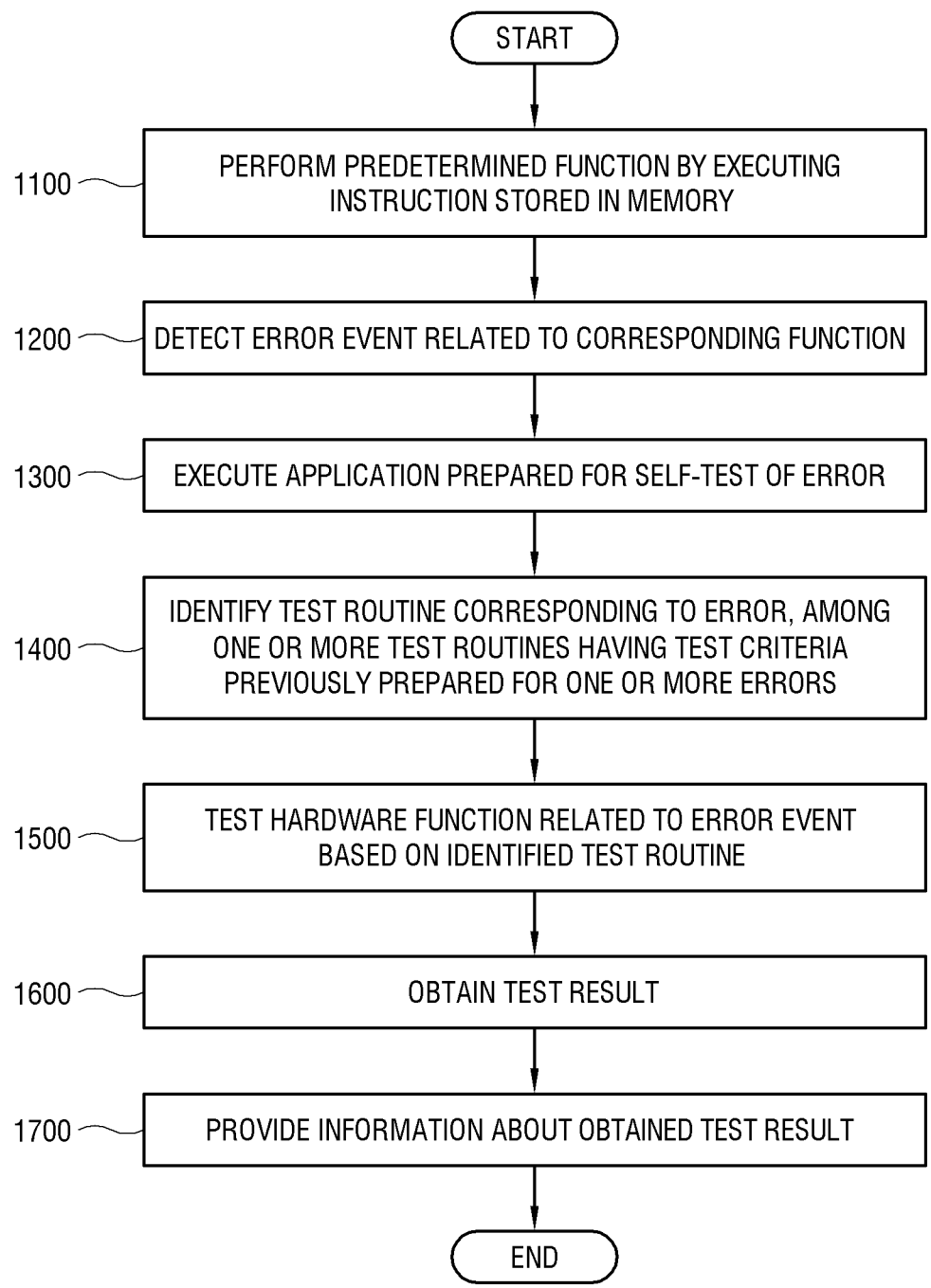
FIG. 3 is a flowchart illustrating an example control method of the electronic apparatus according to various embodiments.

FIG. 3 is a flowchart illustrating an example method of controlling the electronic apparatus according to various embodiments.

As shown in FIGS. 1 and 3, the following operations may be performed by the processor 100 of the electronic apparatus 1.

At operation 1100 the electronic apparatus 1 performs a predetermined (specified) function by executing an instruction stored in the memory 150. Such an instruction may correspond to a predetermined first application 203 connected to the hardware of the electronic apparatus 1, a driver for driving the hardware, etc. As an example of the first application 203 and the driver, a camera module driver for driving the camera module 550, and a camera app for taking an image of the camera module may be installed on the operating system 201. When a user issues a command to take an image through the camera app, the camera module driver is driven based on a control signal from the camera app, and the camera module 550 performs taking an image. A web surfing operation in a web browser app is enabled by accessing a network through the communication module 900.

At operation 1200 the electronic apparatus 1 detects an error event notifying that an error has occurred in relation to the corresponding function.

At operation 1300 the electronic apparatus 1 executes a second application for a self-test of the error in response to the error event. The second application refers to an application different from the first application 203 connected to the hardware in the previous operations, and is also called a self-test application for convenience of description. At a point in time when the error event happens, the self-test application may be running as residing in the memory 150 (e.g., running in the background). The self-test application may be executed in the background in response to a user input instruction while the electronic apparatus 1 is operating, or may be set to be automatically executed in the background when the electronic apparatus 1 is booted up. The self-test application may be executed after receiving confirmation from a user through a user interface (UI), which will be described later. Alternatively, the self-test application may not be running at the point in time when the error event occurs, and may be executed in response to the occurrence of the error event.

At operation 1400 the electronic apparatus 1 identifies a test routine corresponding to an error among one or more test routines having test criteria previously provided corresponding to one or more error events as the self-test application is executed. The test criteria may for example be provided in a processing operation of the electronic apparatus 1, which exhibits performance optimized for the electronic apparatus 1. However, the point in time when the test criteria are provided is not necessarily limited to such a processing stage. The self-test application has one or more test routines, and operates to select the test routine corresponding to the error notified by the error event. Here, each test routine refers to a process for performing a test, which includes a test item corresponding to the error and a pass criterion for the test item.

According to errors that have occurred, a test routine corresponding to an error may not be identified among one or more test routines. In this case, the electronic apparatus 1 may perform a separately prepared additional operation. For example, the electronic apparatus 1 may inform a user of the error by a method of making the display module 400 display notification of a current state, such as a notice of the self-test application about an abnormal state, guidance on visiting a near customer service center, etc. and a message about what a user can do to deal with the error, or the like method. Alternatively, when the self-test application is provided by the server 10, the electronic apparatus 1 may access the server 10 to check whether there is an updated version of the self-test application, and download and execute the self-test application again according to check results.

At operation 1500 the electronic apparatus 1 tests the hardware function related to the error event, based on the identified test routine.

At operation 1600 the electronic apparatus 1 obtains a test result.

At operation 1700 the electronic apparatus 1 provides information about the obtained test result. There are various methods of providing such information. For example, the electronic apparatus 1 displays the information on the display module 400, or transmit the information to the external electronic apparatus 2 or 4 or the server 10 through the communication module 900. Further, the electronic apparatus 1 may transmit not only the information about the test result, but also a log file about the error event, information about a test environment, information about specifications of the electronic apparatus 1, etc. to a previously authenticated external apparatus (e.g., a testing apparatus managed by the customer service center of the manufacturer, a server managed by a manufacturer, etc.) through communication connection (e.g., wireless communication). Thus, the manufacturer may manage a location where a specific error occurs, and a frequency at which the error occurs, according to the models of the electronic apparatus 1, thereby deriving a problem of a specific model design itself, and modifying the design or updating the self-test application.

Accordingly, when the error has occurred, the electronic apparatus 1 executes the self-test application, and performs the self-test based on the test criterion provided in the processing stage. Thus, the electronic apparatus 1 can autonomously and accurately diagnose the cause of the error without the help of an external device.

Below, in terms of software, it will be described how the foregoing operations are performed in the electronic apparatus 1.

Figure 4:
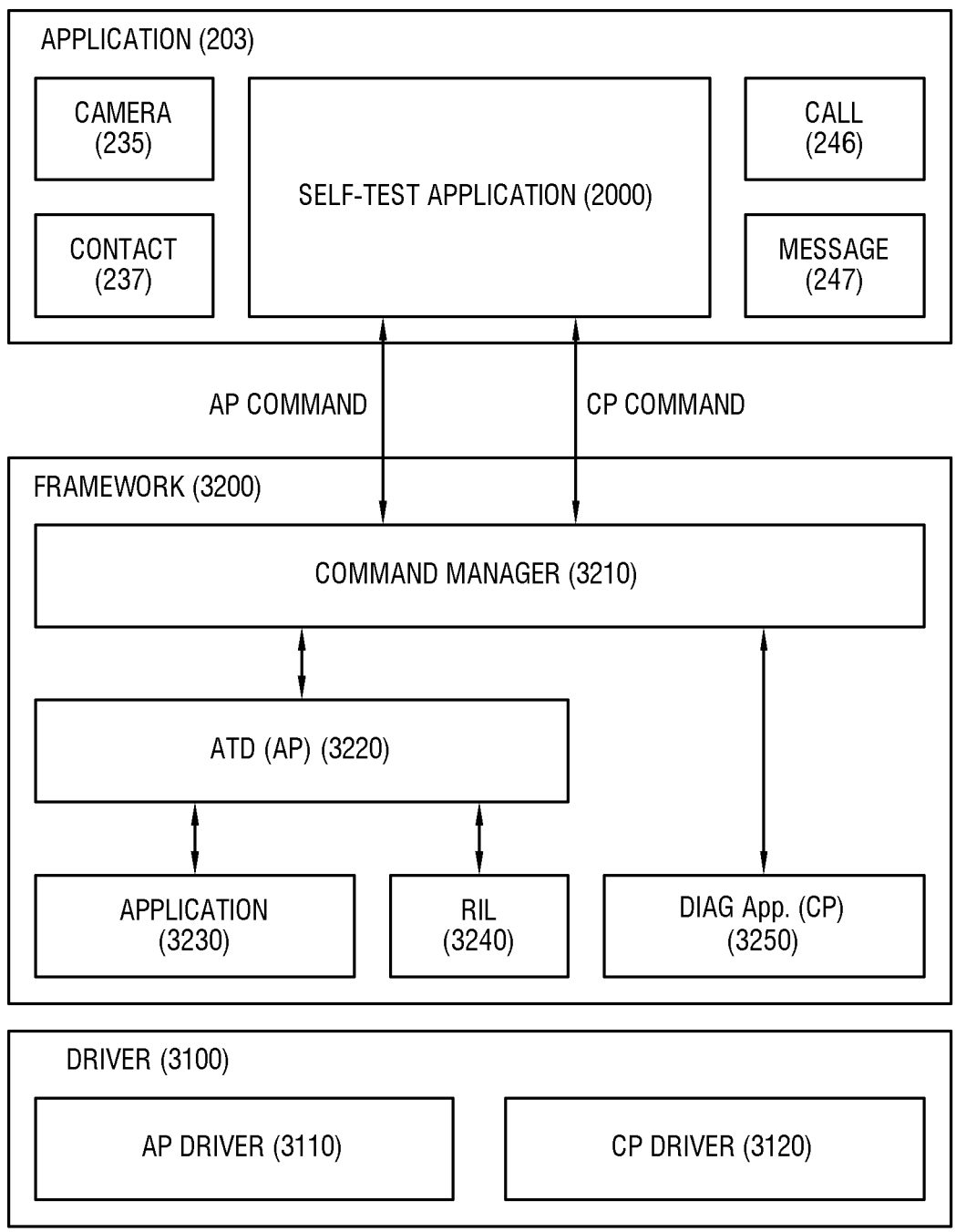
FIG. 4 is a diagram illustrating an example hierarchical structure driven by an application in the electronic apparatus according to various embodiments.

FIG. 4 is a diagram illustrating an example hierarchical structure driven by an application in the electronic apparatus according to various embodiments.

As shown in FIGS. 1 and 4, the electronic apparatus 1 schematically has a software hierarchical structure of a driver 3100, a framework 3200, and the application 203. The driver 3100 refers to a lower layer for driving the hardware, which may for example be included in the operating system 201. The framework 3200 refers to an upper layer of the driver 3100 and a lower layer of the application 203, which may for example be included in the operating system 201 or the middleware 202. The framework 3200 may for example serve to allocate and relay commands transmitted and received between the driver 3100 and the application 203. The application 203 refers to an upper layer of the framework 3200, which may be provided to implement various functions when executed.

The driver 3100 includes an AP driver 3110 for controlling operations of an application processor (AP) to perform central processing. The AP driver 3110 may for example be provided to control operations of the main processor 110. Further, the driver 3100 includes a communication (or cellular) processor (CP) driver 3120 for controlling operations of a CP to implement a communication function. The CP driver 3120 may for example be provided to control operations of the auxiliary processor 120. A command received from the framework 3200 by the driver 3100 may be divided into a AP command related to the operations of the main processor 110, and a CP command related to the operations of the auxiliary processor 120. The AP command is processed by the AP driver 3110, and the CP command is processed by the CP driver 3120.

The framework 3200 includes a command manager (CM) 3210. The command manager 3210 identifies a target to which the commands received from the driver 3100 and the application 203 are required to be transmitted, and performs a relaying operation to transmit the corresponding command to the identified target. For example, the command manager 3210 transmits the AP command from the application 203 to an attention daemon (ATD) 3220, and transmits the CP command from the application 203 to a diagnosis application (DIAG App.) 3250. Further, the command manager 3210 transmits the AP command from the ATD 3220 and the CP command from the DIAG App. 3250 to a target application identified among the applications 203.

The ATD 3220 refers to a daemon that typically carries out the AT command (e.g., a command for scheduling a one-time job). The daemon refers to a process that resides as a background program in the memory and is on standby to immediately respond to a specific request. In this embodiment, the ATD 3220 serves to retransmit and distribute the AP command received from the command manager 3210. According to the types of the AP commands, the ATD 3220 transmits a corresponding command to an application 3230 (an element in the framework 3200 provided to process the command related to the application 203) or a radio interface layer (RIL) (providing an abstraction layer between a telephony service and radio hardware) 3240. Further, the ATD 3220 transmits a command received from the application 3230 or the RIL 3240 to the command manager 3210.

In an embodiment, the DIAG App. 3250 is described as an example. However, the application for controlling the CP in the framework 3200 is not limited to the DIAG App. 3250. Besides the DIAG App. 3250, the application for controlling the CP may include a Meta App. etc. The DIAG App. 3250 transmits the CP command from the command manager 3210 to the CP driver 3120, and transmits the CP command from the CP driver 3120 to the command manager 3210.

The application 203 includes applications for various functions such as the camera 235, the contact 237, the call 246, the message 247, etc. In this embodiment, a self-test application 2000 for the self-test of the electronic apparatus 1 is provided in the application 203. The self-test application 2000 may be executed in response to an error event in a state that it is not initially running, or may perform a self-test process in response to the error event while running as a background process in the form of the daemon. The self-test application 2000 transmits and receives the commands to and from the components of the framework 3200 or the driver 3100, under the foregoing structure of the framework 3200.

Figure 5:
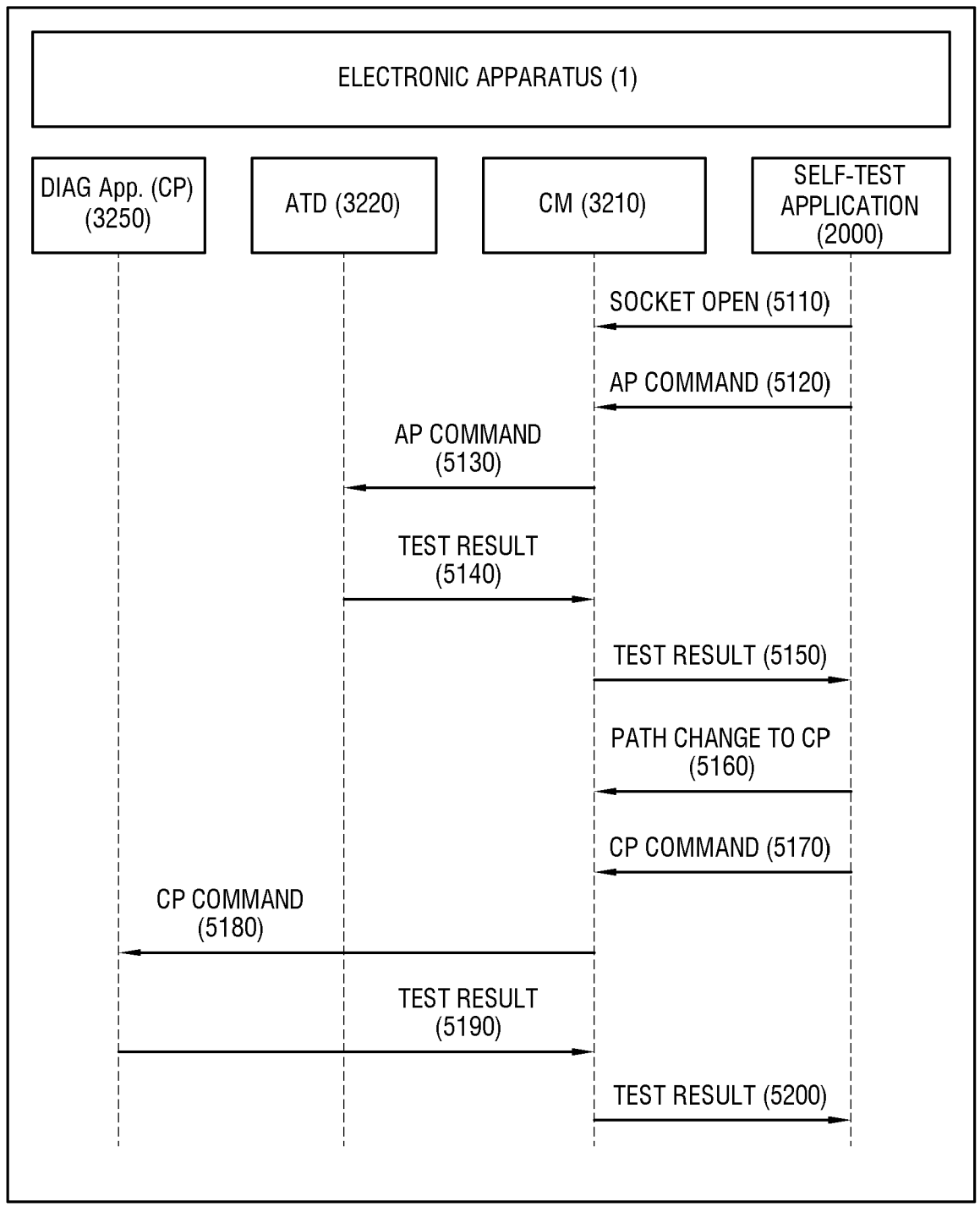
FIG. 5 is a signal flow diagram illustrating an example outline that the self-test application of FIG. 4 communicates with components of a framework according to various embodiments.

FIG. 5 is a signal flow diagram illustrating an example outline that the self-test application of FIG. 4 communicates with components of a framework according to various embodiments.

As shown in FIGS. 1, 4 and 5, at operation 5110 the self-test application 2000 opens a communication socket for communication with the command manager (CM) 3210 in response to detection of an error event.

When an error is related to the AP driver 3110, at operation 5120 the self-test application 2000 transmits the AP command for testing the function, in which the error has occurred, to the command manager 3210. At operation 5130 the command manager 3210 transmits the AP command to the ATD 3220. The ATD 3220 allows the test based on the received AP command to be performed by the AP driver 3110, and at operation 5140 transmits a test result to the command manager 3210. At operation 5150 the command manager 3210 transmits the test result to the self-test application 2000.

When an error is related to the CP driver 3120, at operation 5160 the self-test application 2000 changes a communication path toward the CP driver 3120. At operation 5170 the self-test application 2000 transmits the CP command for testing the function, in which the error has occurred, to the command manager 3210. At operation 5180 the command manager 3210 transmits the CP command to the DIAG App. 3250. The DIAG App. 3250 allows the test based on the received CP command to be performed by the CP driver 3120, at operation 5190 transmits a test result to the command manager 3210. At operation 5200 the command manager 3210 transmits the test result to the self-test application 2000.

Thus, the self-test application 2000 may obtain the result of testing the function in which the error has occurred, and identify the cause of the error based on the obtained test result.

Figure 6:
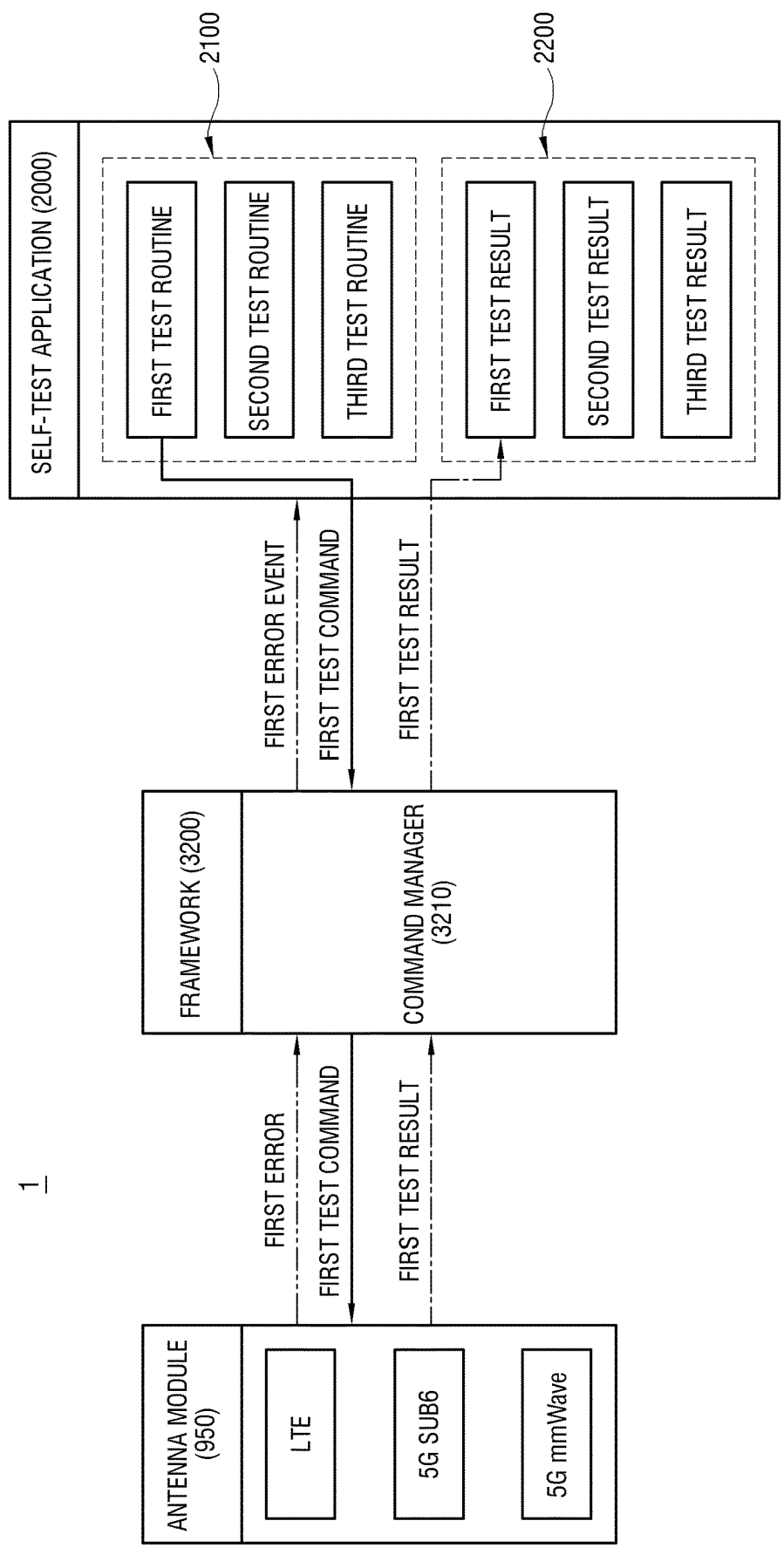
FIG. 6 is a diagram illustrating example operations of a self-test application according to various embodiments.

FIG. 6 is a diagram illustrating example operations of a self-test application according to various embodiments.

As shown in FIG. 6, for example, when a first error occurs in relation to the operations of the antenna module 950 including long term evolution (LTE), 5G SUB6, 5G mmWave, etc., a signal indicating the first error is transmitted to the command manager 3210 of the framework 3200. The command manager 3210 generates a first error event indicating the first error.

The self-test application 2000 includes one or more test routines 2100. One or more test routines 2100 refer to processes for testing various types of hardware or software of the electronic apparatus 1, which have test criteria measured in the processing stage of the electronic apparatus 1 in order to identify whether a test result 2200 shows normality or abnormality. The test criteria may have various forms according to multiple factors such as a target to be tested, a testing method, a format of the test result 2200, etc. For example, when the test result 2200 is represented with a numerical value, the test criterion indicates a numerical range corresponding to the normality. The normality is identified when the numerical value of the test result 2200 falls within the numerical range of the test criterion, but the abnormality is identified otherwise. Alternatively, the test criterion may be represented with various codes (e.g., hexa-code, American standard code for information interchange (ascii) code, etc.) including a binary code indicating the normality. The normality is identified when similarity based on a result of comparison between the binary code of the test result 2200 and the code of the test criterion is greater than a threshold, but the abnormality is identified otherwise. Besides, the test criteria may be provided by various methods. For example, the test criterion may be provided reflecting the test result 2200 measured in the processing stage in which the normality of the electronic apparatus 1 is secured.

The processing stage or the manufacturing stage refers to a stage before the electronic apparatus 1 is released and sold to and used by a user. Once the electronic apparatus 1 is sold to a user, the hardware/software states of the electronic apparatus 1 are varied depending on users' different use methods and environments, and thus an error may occur in the electronic apparatus 1. The processing stage gives an opportunity for the manufacturer to secure the normality of the electronic apparatus 1 before the state of the electronic apparatus 1 is varied as above. The manufacturer prepares the test criteria for various errors of the electronic apparatus 1 in the processing stage, and such test criteria reflect the normality of the electronic apparatus 1 which is not changed by at least unspecified use environments.

One or more test routines 2100 are provided corresponding to one or more error events expected to occur in the electronic apparatus 1, respectively. When an error event occurs, the self-test application 2000 selects or identifies a test routine 2100 corresponding to the error event among one or more test routines 2100. For example, when the first error event occurs, the self-test application 2000 selects and executes a first test routine 2100 corresponding to the first error event.

As the first test routine 2100 is executed, the self-test application 2000 transmits a first test command to the command manager 3210, and the command manager 3210 transmits the first test command to the antenna module 950 related to the first error, so that the antenna module 950 can be subjected to the first test based on the first test routine 2100. This test refers to a test for diagnosing a state of a hardware/software target (e.g., the antenna module 950, a driver for driving the antenna module 950, firmware, etc.) based on the test criterion stipulated by the first test routine 2100. When the first test is over, the command manager 3210 transmits a first test result 2200 as a result of the first test to the self-test application 2000.

The self-test application 2000 stores the first test result 2200 received from the command manager 3210. In this case, the self-test application 2000 may store the first test result 2200 in a security memory region managed by the self-test application 2000. A log file related to the operation of the electronic apparatus 1 at the moment of the error occurrence may be additionally stored in the security memory region. The self-test application 2000 compares the first test result 2200 with the test criterion according to the first test routine 2100, thereby identifying whether the antenna module 950 is normal or not. When the first test result 2200 shows that the antenna module 950 is abnormal, the self-test application 2000 identifies that the first error event is caused by the antenna module 950 (in other words, that the first error event is caused by the electronic apparatus 1 itself). When the first test result 2200 shows that the antenna module 950 is normal, the self-test application 2000 identifies that the first error is caused by not the electronic apparatus 1 but the outside (for example, the first error may be caused by equipment or the like of a communication base station communicating with the antenna module 950).

Depending on the error that has occurred, the test routine 2100 selected by the self-test application 2000 and the test criterion for identifying the normality may be varied. For example, when a second error event occurs in relation to hardware/software other than the antenna module 950, the self-test application 2000 selects a second test routine 2100 corresponding to the second error event. The second test routine 2100 also has its own test criterion prepared in the processing stage of the electronic apparatus 1 in order to identify the normality. The test is carried out as the second test routine 2100 is executed, and the self-test application 2000 identifies the cause of the second error based on the second test result 2200.

The self-test application 2000 may be stored in the electronic apparatus 1 at the processing stage of the electronic apparatus 1, or may be downloaded and updated from the server by the electronic apparatus 1. Although the processing stage of the electronic apparatus 1 gives an opportunity to secure the normality of the electronic apparatus 1, the test criterion for securing the normality may be changed due to separate factors. For example, when the operating system of the electronic apparatus 1 is upgraded, the normality of the electronic apparatus 1 needs to take the conditions of the upgraded operating system into consideration (because the upgraded operating system is not the operating system in the processing stage). By taking such a case into account, the self-test application 2000 provided in the electronic apparatus 1 is updatable.

In case where the electronic apparatus 1 is practically used, an example of a UI displayed on the electronic apparatus 1 when an error has occurred will be described below.

Figure 7:
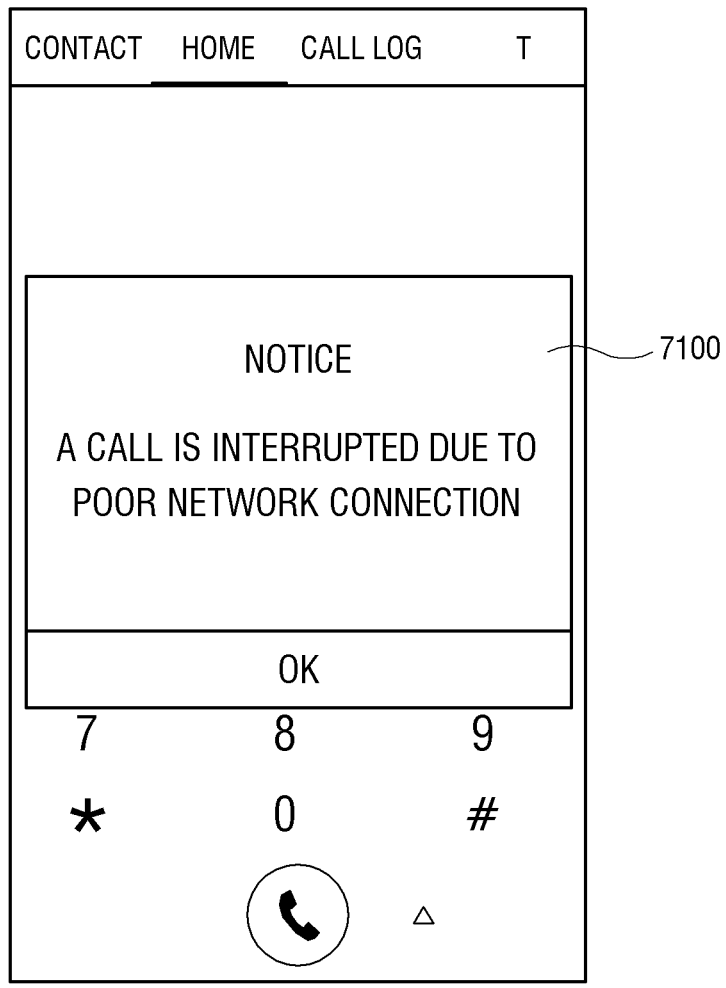
FIG. 7 is a diagram illustrating an example user interface (UI) informing that an error has occurred in an electronic apparatus according to various embodiments.

FIG. 7 is a diagram illustrating an example UI informing that an error has occurred in an electronic apparatus according to various embodiments.

As shown in FIG. 7, when an error event is detected due to occurrence of an error in a predetermined function, the electronic apparatus 1 displays a UI 7100 showing the content of the error event. The UI 7100 informs a user of the currently detected function and error. For example, the electronic apparatus 1 may detect a connection error of a communication network in a telephony function. In this case, the electronic apparatus 1 displays the UI 7100 showing that a call is currently interrupted because the network connection is in an abnormal state. Through the UI 7100A, a user may recognize that the error has occurred in the current function.

After displaying the UI 7100 showing the content of the error event, the electronic apparatus 1 executes the self-test for identifying the cause of the error. The electronic apparatus 1 may automatically execute the self-test, or may ask a user about whether to execute the self-test. For example, the self-test application 2000 may automatically execute a test routine corresponding to the error event in the background when the error event occurs, or may execute the self-test after receiving a user's conformation through the UI based on the user's setting (in other words, based on whether a user has set the UI to be displayed when the error occurs).

Figure 8:
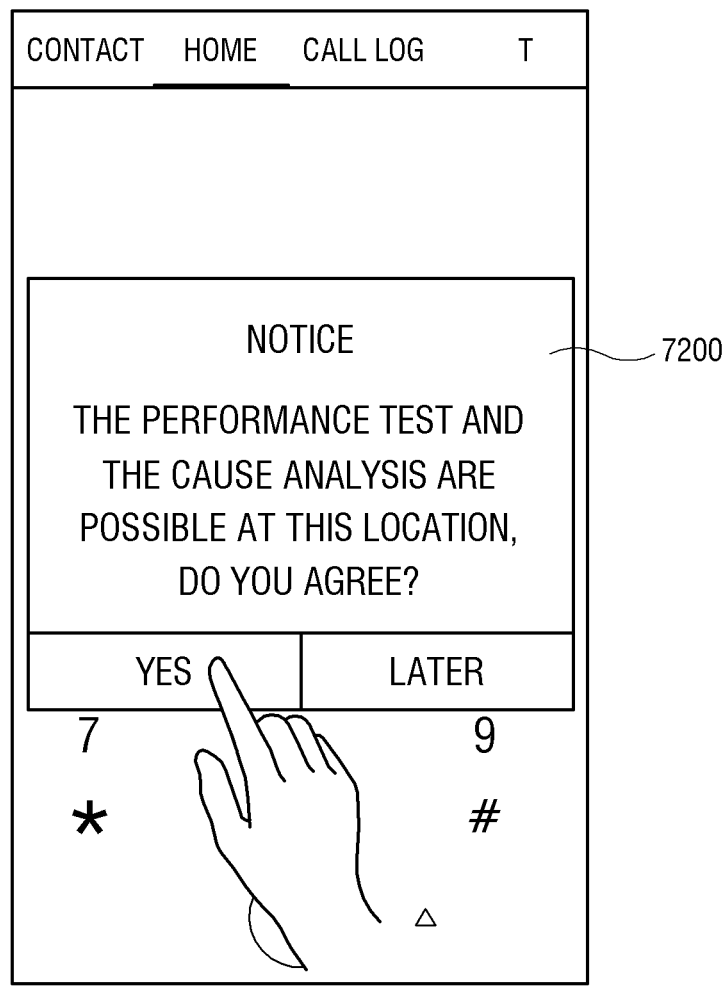
FIG. 8 is a diagram illustrating an example UI asking whether to execute a self-test in an electronic apparatus according to various embodiments.

FIG. 8 is a diagram illustrating an example UI asking whether to execute a self-test in an electronic apparatus according to various embodiments.

As shown in FIG. 8, for example, the electronic apparatus 1 displays a UI 7200 to ask a user about whether to perform the self-test with regard to an error. The UI 7200 provides an option to execute the self-test and an option not to execute the self-test. When a user selects the option not to execute the self-test through the UI 7200, the electronic apparatus 1 does not execute the self-test. When a user selects the option to execute the self-test through the UI 7200, the electronic apparatus 1 executes the self-test.

The electronic apparatus 1 identifies the cause of the error according to results of the self-test, and informs a user of the cause of the error.

Figure 9:
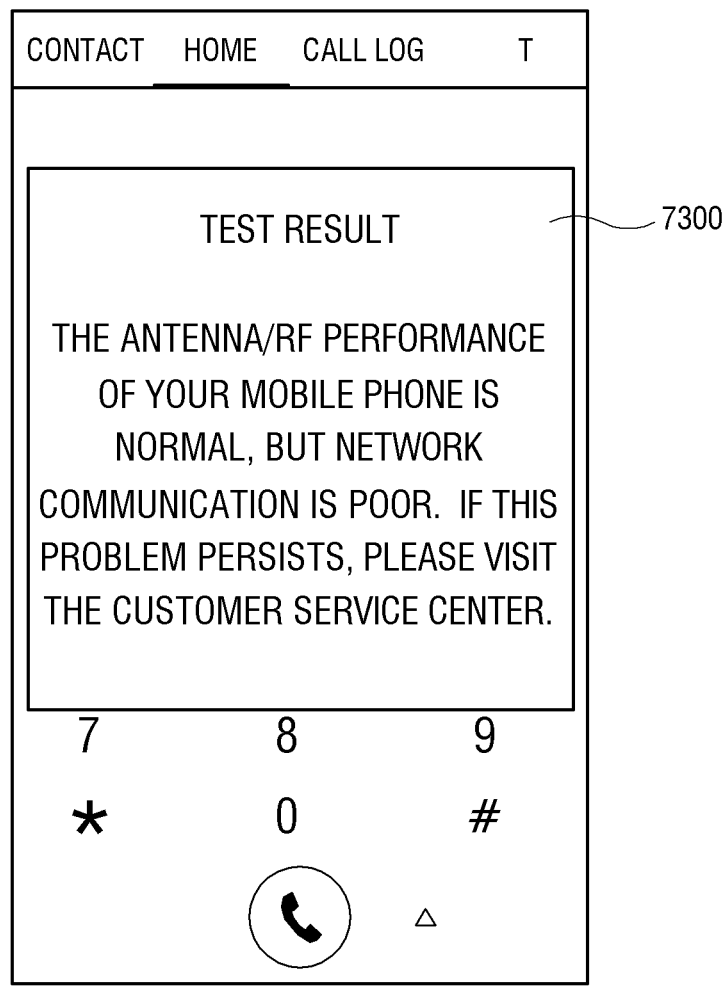
FIG. 9 is a diagram illustrating an example UI displayed in an electronic apparatus when an error is caused by an external factor of the electronic apparatus according to various embodiments.

FIG. 9 is a diagram illustrating an example UI displayed in an electronic apparatus when an error is caused by an external factor of the electronic apparatus according to various embodiments.

As shown in FIG. 9, when it is identified that internal factors (e.g., hardware and software) of the electronic apparatus 1 subjected to the test are in a normal state based on a result of the self-test, the electronic apparatus 1 displays a UI 7300 showing the result of the self-test. For example, when the self-test is targeted for an antenna/RF and a test result shows the normality of the antenna/RF, the error is caused by not the antenna/RF but an external factor of the electronic apparatus 1. Therefore, the UI 7300 notifies that the antenna/RF of the electronic apparatus 1 being currently used has normal performance. Through the UI 7300, a user can recognize that the current error is not caused by a defect in the electronic apparatus 1 itself.

Figure 10:
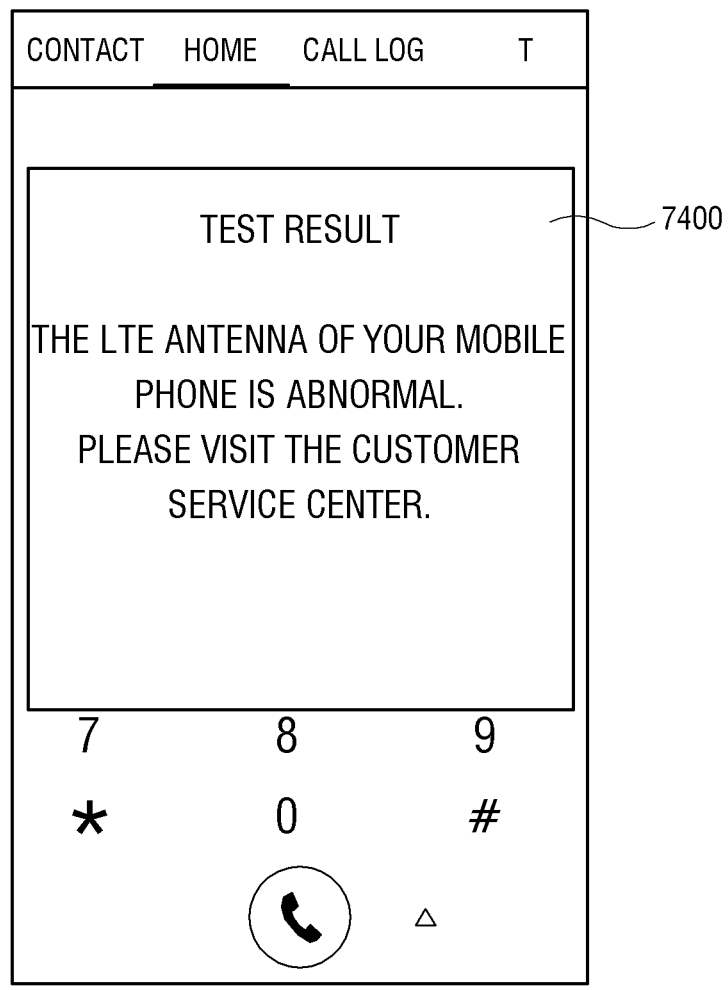
FIGS. 10 and 11 are diagrams illustrating example UIs displayed in an electronic apparatus when an error is caused by an internal factor of the electronic apparatus according to various embodiments.
Figure 11:
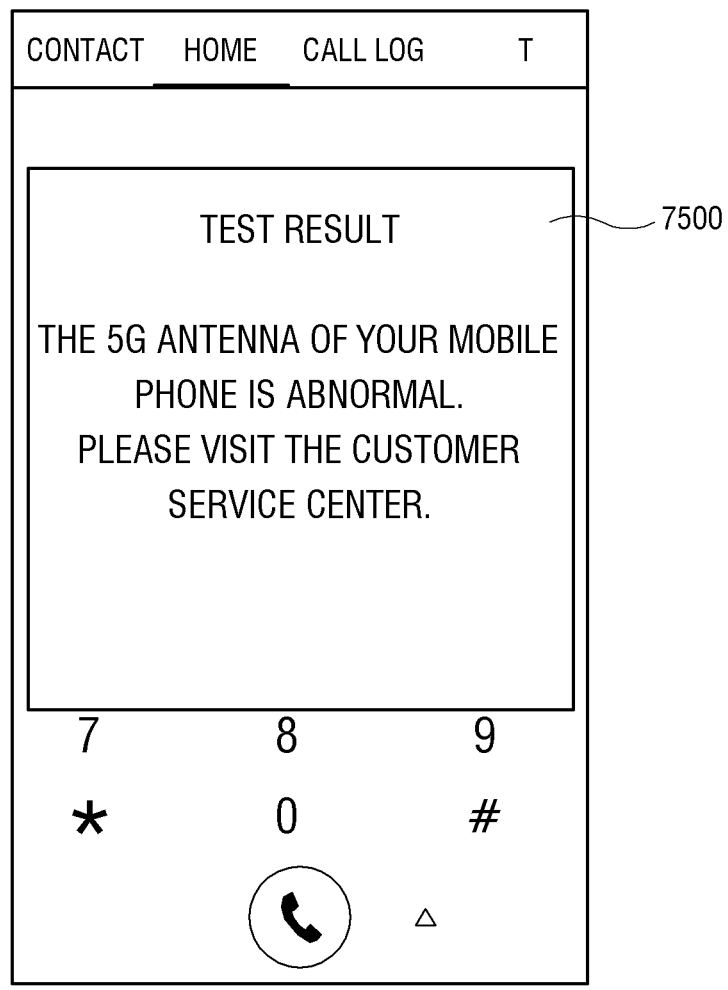

FIGS. 10 and 11 are diagrams illustrating example UIs displayed in an electronic apparatus when an error is caused by an internal factor of the electronic apparatus according to various embodiments.

As shown in FIGS. 10 and 11, when it is identified that internal factors (e.g., hardware and software) of the electronic apparatus 1 subjected to the test are in an abnormal state based on a result of the self-test, the electronic apparatus 1 displays a UI 7400, 7500 showing the result of the self-test. For example, when the self-test is targeted for the antenna/RF and a test result shows the abnormality of the antenna/RF, the error is caused by the internal factors (e.g., the antenna/RF) of the electronic apparatus 1. Therefore, the UI 7400, 7500 notifies that the antenna/performance of the electronic apparatus 1 being currently used is abnormal. Through the UI 7400, 7500, a user can recognize that the current error is caused by a defect in the electronic apparatus 1 itself. In addition, the UI 7400, 7500 may guide actions (e.g., a visit to a customer service center) that a user can take to repair the defect in the electronic apparatus 1

The UI 7400, 7500 may specifically show a defective element of the electronic apparatus 1 according to the test results. For example, the antenna/RF includes various sub elements such as LTE, 5G, etc. The electronic apparatus 1 may display the UI 7400 showing that an LTE antenna is abnormal when an element detected as having a defect is the LTE antenna, or may display the UI 7500 showing that a 5G antenna is abnormal when an element detected as having a defect is the 5G antenna.

Figure 12:
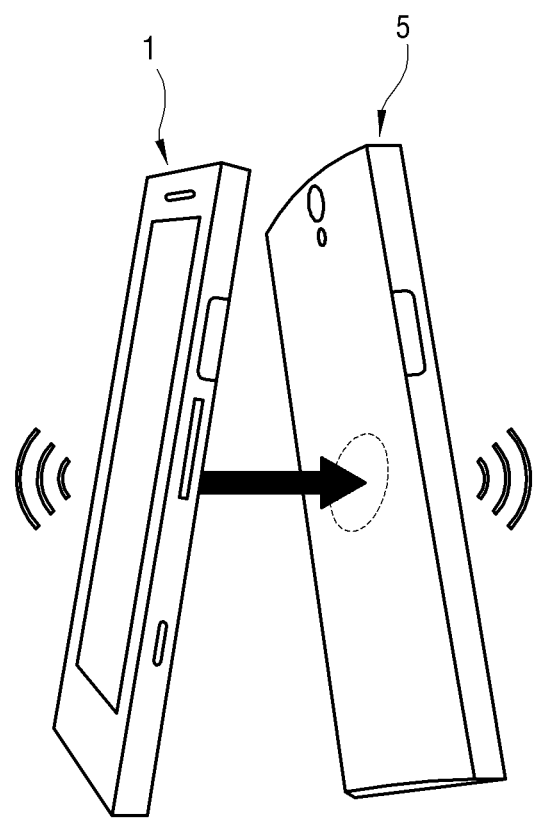
FIG. 12 is a diagram illustrating an example of an electronic apparatus transmitting a result of self-test to an external apparatus through near field communication (NFC) according to various embodiments.

FIG. 12 is a diagram illustrating an electronic apparatus transmitting a result of self-test to an external apparatus through near field communication (NFC) according to various embodiments.

As shown in FIG. 12, the electronic apparatus 1 may transmit a test result of the self-test to an external apparatus 5. The external apparatus 5 may be an apparatus previously authenticated to receive the test result from the electronic apparatus. The electronic apparatus 1 may transmit not only the test result, but also various pieces of information related to diagnosis (e.g., information about specifications or the like characteristics of the electronic apparatus 1, information related to the model of the electronic apparatus 1, information about a network environment, a use sequence, etc.). When an error is related to a communication network and the LTE or 5G communication of the electronic apparatus 1 is interrupted, the electronic apparatus 1 transmits the test result through a separate possible method among the communication network methods. For example, the electronic apparatus 1 approaches an external apparatus 5 and transmits the test result to the external apparatus 5 through the NFC. The electronic apparatus 1 may use Wi-Fi to transmit the test result.

This method may, for example, be used when a user visits the customer service center to correct an error in the electronic apparatus 1. The electronic apparatus 1 transmits the test result to the external apparatus 5 provided in the customer service center, so that the customer service center can recognize the problem of the electronic apparatus 1.

As described above, the test result of the self-test performed in the electronic apparatus 1 may be transmitted to a server for a manufacturer as well as the external apparatus 5 provided in the customer service center, etc. Even though the error is not caused by the internal factors of the electronic apparatus 1, the test result of the electronic apparatus 1 is transmitted to the server for the manufacturer, and thus utilized in the follow-up service of the manufacturer. For example, when the same type of error occurs only in a specific model of the electronic apparatus 1, the manufacturer may more quickly identify and deal with the cause of the error. For instance, the specific model of the electronic apparatus 1 may fail to communicate with a base station in a specific area, while normally communicating with a base station in another area. This is because communication parts of the electronic apparatus 1 of this model have a problem in communication with equipment of the base station in the specific area. Therefore, the manufacturer may more quickly identify and deal with whether to repair a communication part of the electronic apparatus 1, update a driver for the communication part, repair communication equipment of the base station, etc.

The operations of the apparatus described above in the foregoing example embodiments may be performed by artificial intelligence installed in the apparatus. The artificial intelligence may be applied to various systems based on machine learning algorithms. The artificial intelligence system refers to a computer system that implements human-level intelligence or near human-level intelligence, in which a machine, device or system autonomously learns and makes a decision, and a recognition rate and a decision accuracy are improved based on accumulated use experiences.

Artificial intelligence technology is based on elementary technology by utilizing machine learning technology and algorithms using an algorithm of autonomously classifying/learning features of input data to copy perception, determination and the like functions of a human brain.

The elementary technology may for example include at least one of linguistic comprehension technology for recognizing a language/text of a human, visual understanding technology for recognizing an object like a human sense of vision, deduction/prediction technology for identifying information and logically making deduction and prediction, knowledge representation technology for processing experience information of a human into knowledge data, and motion control technology for controlling a vehicle's automatic driving or a robot's motion.

The linguistic comprehension refers to technology of recognizing and applying and processing a human's language or character, and includes natural language processing, machine translation, conversation system, question and answer, speech recognition and synthesis, etc.

The deduction/prediction refers to technology of identifying information and logically making prediction, and includes knowledge and possibility-based deduction, optimized prediction, preference-based plan, recommendation, etc.

The knowledge representation refers to technology of automating a human's experience information into knowledge data, and includes knowledge building such as data creation and classification, knowledge management such as data utilization, etc.

The methods according to the foregoing embodiments may be achieved in the form of a program instruction that can be implemented in various computers, and recorded in a computer readable medium. Such a computer readable medium may include a program instruction, a data file, a data structure or the like, or combination thereof. For example, the computer readable medium may be stored in a nonvolatile storage unit such as universal serial bus (USB) memory, regardless of whether it is deletable or rewritable, for example, a RAM, a ROM, a flash memory, a memory chip, an integrated circuit (IC) or the like memory, or an optically or magnetically recordable or machine (e.g., a computer)-readable storage unit medium, for example, a compact disk (CD), a digital versatile disk (DVD), a magnetic disk, a magnetic tape or the like. It will be appreciated that a memory, which can be included in a mobile terminal, is an example of the machine-readable storage unit medium suitable for storing a program having instructions for realizing the embodiments. The program instruction recorded in this storage unit medium may be specially designed and configured according to the embodiments, or may be publicly known and available to those skilled in the art of computer software. Further, the computer program instruction may be implemented by a computer program product.

While the disclosure has been illustrated and described with reference to various example embodiments, it will be understood that the various example embodiments are intended to be illustrative, not limiting. It will be further understood by those skilled in the art the various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic apparatus comprising:
a memory configured to store a program to perform at least one function; and
at least one processor configured to:
implement the at least one function of the electronic apparatus by executing the program stored in the memory,
in response to occurrence of an error related to the function, execute a self-test application provided for a self-test of the error, and identify a test routine for the error among one or more test routines, wherein the test routine comprises a test criterion for the error, the test criterion reflecting a status of the electronic apparatus in a manufacturing stage,
obtain a test result of the error by testing the function based on the test routine, and
output information about the test result to a display.

2. The electronic apparatus according to claim 1, further comprising a wireless communication module comprising communication circuitry configured to wirelessly communicate with an external apparatus,
wherein the at least one processor is configured to control the wireless communication module to transmit the information about the test result to the external apparatus.

3. The electronic apparatus according to claim 2, wherein the information includes conditions of the self-test, characteristics of the electronic apparatus, and operations of the electronic apparatus.

4. The electronic apparatus according to claim 1, wherein the at least one processor is configured to:
identify a component of the electronic apparatus for implementing the function,
obtain the test result by testing the component with the test routine,
identify that the error is occurred due to the electronic apparatus based on the test result showing abnormality, and
identify that the error is not occurred due to the electronic apparatus based on the test result showing normality.

5. The electronic apparatus according to claim 1, wherein the self-test application is configured to: operate as a background process, and identify the test routine corresponding to the error based on the occurrence of the error.

6. The electronic apparatus according to claim 1, wherein the at least one processor is configured to store the test result in a security storage region of the memory to be managed by the self-test application.

7. The electronic apparatus according to claim 1, wherein the at least one processor is configured to: control the display to display a user interface (UI) requesting an input about whether to execute the self-test in response to the occurrence of the error, and execute the self-test based on an input received through the UI.

8. A method of controlling an electronic apparatus, the method comprising:
implementing at least one function of the electronic apparatus by executing a program stored in a memory;
in response to occurrence of an error related to the function, executing a self-test application provided for a self-test of the error, and identifying a test routine for the error among one or more test routines, wherein the test routine comprises a test criterion for the error, the test criterion reflecting a status of the electronic apparatus in a manufacturing stage;
obtaining a test result of the error by testing the function based on the test routine; and
outputting information about the test result to be displayed.

9. The method according to claim 8, further comprising wirelessly transmitting the information about the test result to an external apparatus.

10. The method according to claim 9, wherein the information includes conditions of the test, characteristics of the electronic apparatus, and operations of the electronic apparatus.

11. The method according to claim 8, further comprising:
identifying a component of the electronic apparatus for implementing the function,
obtaining the test result by testing the component with the test routine,
identifying that the error is occurred due to the electronic apparatus based on the test result showing abnormality, and
identifying that the error is not occurred due to the electronic apparatus based on the test result showing normality.

* * * * *